United States Patent [19]

Kayserman

[11] Patent Number: 5,698,975

[45] Date of Patent: Dec. 16, 1997

[54] MOUNTING AND COUPLING ARRANGEMENT FOR A PROXIMITY SENSOR

[75] Inventor: Isak Kayserman, Needham, Mass.

[73] Assignee: Allen-Bradley Company, Inc., Milwaukee, Wis.

[21] Appl. No.: 630,393

[22] Filed: Apr. 10, 1996

[51] Int. Cl.$^6$ ............................. G01B 7/14; H05K 5/00
[52] U.S. Cl. ........................... 324/207.15; 324/207.11; 324/207.26
[58] Field of Search .................... 324/207.11, 207.12, 324/207.15, 207.16, 207.26, 262; 174/52.1; 340/693; 439/11, 13; 307/116, 125; 361/679, 728, 755

[56] References Cited

U.S. PATENT DOCUMENTS

| | | | |
|---|---|---|---|
| 2,728,895 | 12/1955 | Quackenbush et al. | 339/89 |
| 5,239,130 | 8/1993 | Brasse | 340/693 |

*Primary Examiner*—Walter E. Snow
*Attorney, Agent, or Firm*—Patrick S. Yoder; John M. Miller; John J. Horn

[57] ABSTRACT

A support and coupling arrangement for a proximity switch includes a support for mounting the switch enclosure in a desired orientation and permitting selective angular orientation of angled pin connectors coupled to the switch. The support includes a bore through which conductors to the switch circuitry pass and a first abutment surface. For interfacing the switch with pin connectors, a connector receptacle is provided in the bore. The receptacle includes a second abutment surface configured to cooperate with the first abutment surface to selectively prevent rotation of the receptacle in the bore. To select the angular orientation of the receptacle, and thereby of the connector, the receptacle is slid within the bore to disengage the abutment surfaces and the receptacle is rotated to the desired orientation. The receptacle is then slid axially to engage the abutment surfaces. Coupling the connector on the support secures or locks the receptacle and the connector in the selected orientation. The support also includes radially extending tabs received in a recess in a base member for selectively positioning the entire switch in a desired orientation. In addition to pin connectors, the support is preferably configured to receive cable connectors designed to be permanently attached to the switch.

17 Claims, 7 Drawing Sheets

MOUNTING AND COUPLING ARRANGEMENT FOR A PROXIMITY SENSOR

BACKGROUND OF THE INVENTION

The present invention relates generally to the field of proximity sensors, especially to inductive proximity sensors. More particularly, the invention relates to a mounting and coupling arrangement for a proximity sensor that facilitates mounting the sensor and its associated wiring in a range of orientations depending upon the physical needs and constraints of the application.

Proximity switches, particularly inductive proximity switches, have become a useful component in a great number of industrial applications, including machine tools, manufacturing and assembly lines. Known inductive proximity sensors typically detect the presence of conductive "targets" made of a variety of materials, both ferrous and non-ferrous, by interaction of an electromagnetic field generated by a coil with secondary magnetic fields induced in the target. The interaction of the magnetic fields results in a change in a detectable parameter, such as current, through a detector circuit and, when the change exceeds a given threshold a trigger circuit changes the state of a switch. The popularity of such sensors has been due to their ability to detect the presence of a target without making actual contact as with conventional mechanical limit switches.

Proximity sensors of the type described generally include a cable for supplying power to the sensor and interfacing the switch with external control circuitry and a housing or enclosure containing the sensor coil and associated circuitry. The cable may be anchored permanently in the sensor package or with a detachable cable assembly equipped with an industry standard plug end, such as a three-pin screwed connection or similar connector with a mating connection on the sensor housing. The latter structure offers the advantage of permitting the sensor to be secured on a machine and wired by simply completing the plug connection. However, because the plug connector in most conventional proximity sensor packages of this type have a fixed orientation with respect to the sensor housing, completing such connections and properly orienting the cable assembly leaving the sensor are often difficult, particularly in tight spaces where such sensors are commonly installed.

Several alternative structures have been proposed to facilitate mounting plug-in proximity sensors. In one known such arrangement, described in U.S. Pat. No. 5,239,130, issued to Brasse on Aug. 24, 1993, a sensor housing may be positioned in a variety of orientations by inverting an angle bracket on a corner of the housing. A cable assembly connector attached rotatably on the housing may be turned to a desired orientation and then fixed from rotation by tightening a set screw provided in an assembly mounting block against the connector collar. By properly orienting the connector, the angle at which a cable assembly leaves the switch housing may be selected and maintained. In this known design, the set screw may pass through one of a series of angularly displaced bores in a cylindrical connecting portion of the housing to define the sensor orientation.

While this arrangement provides a high degree of flexibility in mounting the sensor and orienting the cable assembly, has several disadvantages. For example, a single set screw serves to hold the sensor housing on the mounting block and maintain the orientation of the sensor and the connector. Thus, in the event the set screw becomes loose or stripped, the entire mounting assembly is compromised. Moreover, the angular orientation of the cable assembly is maintained entirely by the force exerted by the set screw on the connector collar and can be inadvertently changed when the cable assembly is coupled or uncoupled with the connector. In addition, setting and securing the angular orientation of the connector requires a hand tool such as a wrench for tightening the set screw as well as clearance for the tool above the set screw. In certain applications where space is limited, partial dismantling of the machine may be required to provide access to the set screw.

The present invention features a novel mounting and coupling arrangement for a proximity sensor that affords a great degree of flexibility in orienting the sensor and the cable assembly while eliminating the drawbacks of the prior an devices described above. The arrangement may be configured to accommodate both an overmolded cable as well as a straight or angled plug-and-receptacle connector. Moreover, the structure of the coupling effectively separates the cable or connector retaining function from the angular orienting function, resulting in a coupling that may be adjusted simply and easily without loosening the sensor mounting and that remains securely in place once tightened in the desired orientation.

SUMMARY OF THE INVENTION

Thus, in accordance with a first aspect of the invention, a proximity sensor includes sensor circuitry, an enclosure housing the sensor circuitry, conductors for coupling the sensor circuitry to an external circuit, a support for mounting the enclosure and a connector receptacle. The support permits the enclosure to be mounted in desired orientations and includes a bore through which the conductors pass as well as a first abutment surface. The connector receptacle is rotatably received within the bore and is coupled to the conductors. The connector receptacle includes a second abutment surface configured to cooperate with the first engagement surface to selectively prevent rotation of the receptacle.

In accordance with another aspect of the invention, a support is provided for a proximity sensor of the type including sensor circuitry for detecting the presence of an object of interest and for changing a state of a switch upon detection of the object, an enclosure housing the sensor circuitry and conductors for coupling the sensor circuitry to an external circuit. The support includes an interface bracket for securing the support to the enclosure, a bore for rotatably receiving a connector receptacle and an abutment for cooperating with a corresponding surface on the connector receptacle to selectively prevent rotation of the receptacle.

In accordance with yet another aspect of the invention, a mounting structure is provided for a proximity switch. The structure comprises a support and a base. The support includes an interface for attaching the support to the switch enclosure, a bore permitting passage of the conductors to the sensor circuitry and a plurality of projections extending substantially radially with respect to the bore. The base includes at least one mounting aperture for attaching the base to a mounting surface and a recess for receiving one of the projections to secure the support in a desired angular orientation.

BRIEF DESCRIPTION OF THE DRAWINGS

The present invention will become more fully understood from the following detailed description, taken in conjunction with the accompanying drawings, wherein like reference numerals refer to like parts, in which.

DESCRIPTION OF THE PREFERRED EMBODIMENTS

Figure 1:
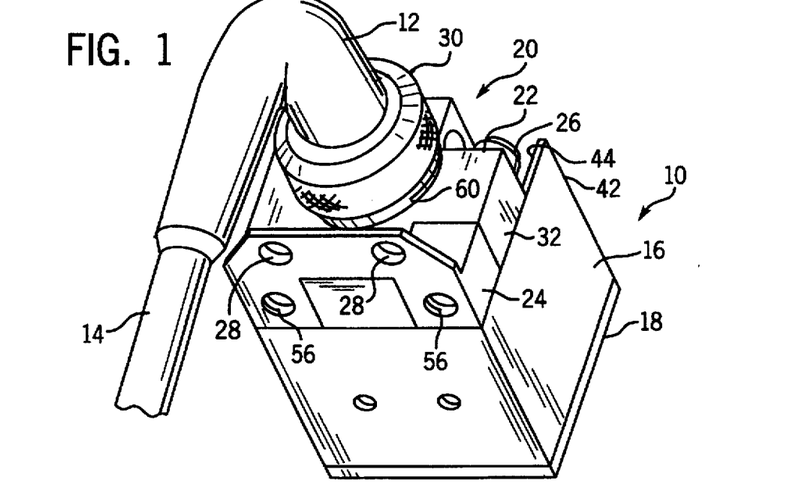
FIG. 1 is a perspective view of an exemplary proximity switch in accordance with the invention, shown coupled to an angled pin connector.

Turning now to the drawings and referring to FIG. 1, a proximity switch 10 is shown coupled to an industry standard pin connector 12 for supplying power to switch 10 and coupling the internal circuitry of the switch with an external control or detection circuit (not shown) via a cable 14. Switch 10 includes a housing or enclosure 16 containing oscillation, detecting and switching circuitry, including a sensing coil (not shown) positioned within housing 16 beneath a sensing face 18. The internal circuitry of switch 10 may be of a type generally known in the art, such as the circuitry contained in inductive proximity switches available from the Allen-Bradley Company of Milwaukee, Wis. under the designation 871L. Switch 10 also includes mounting structure 20 for holding housing 16 on a machine surface or the like (not shown) upon installation of switch 10. Mounting structure 20 generally includes a support 22, that may be mounted directly to machine hardware or affixed to a base 24 by a pair of fasteners 26 (see FIG. 2). Base 24 is provided with a pair of mounting holes 28 for receiving screws, bolts or similar fasteners (not shown) for rigidly attaching base 24 to a mounting surface. After installation of switch 10, connector 12 may be coupled to support 22 via a knurled nut 30 in a conventional manner. As described in detail below, the particular structure of support 22 permits connector 12 to assume a wide range of angular orientations with respect to switch 10 and to be locked into a desired orientation by tightening nut 30 on support 22.

Figure 2:
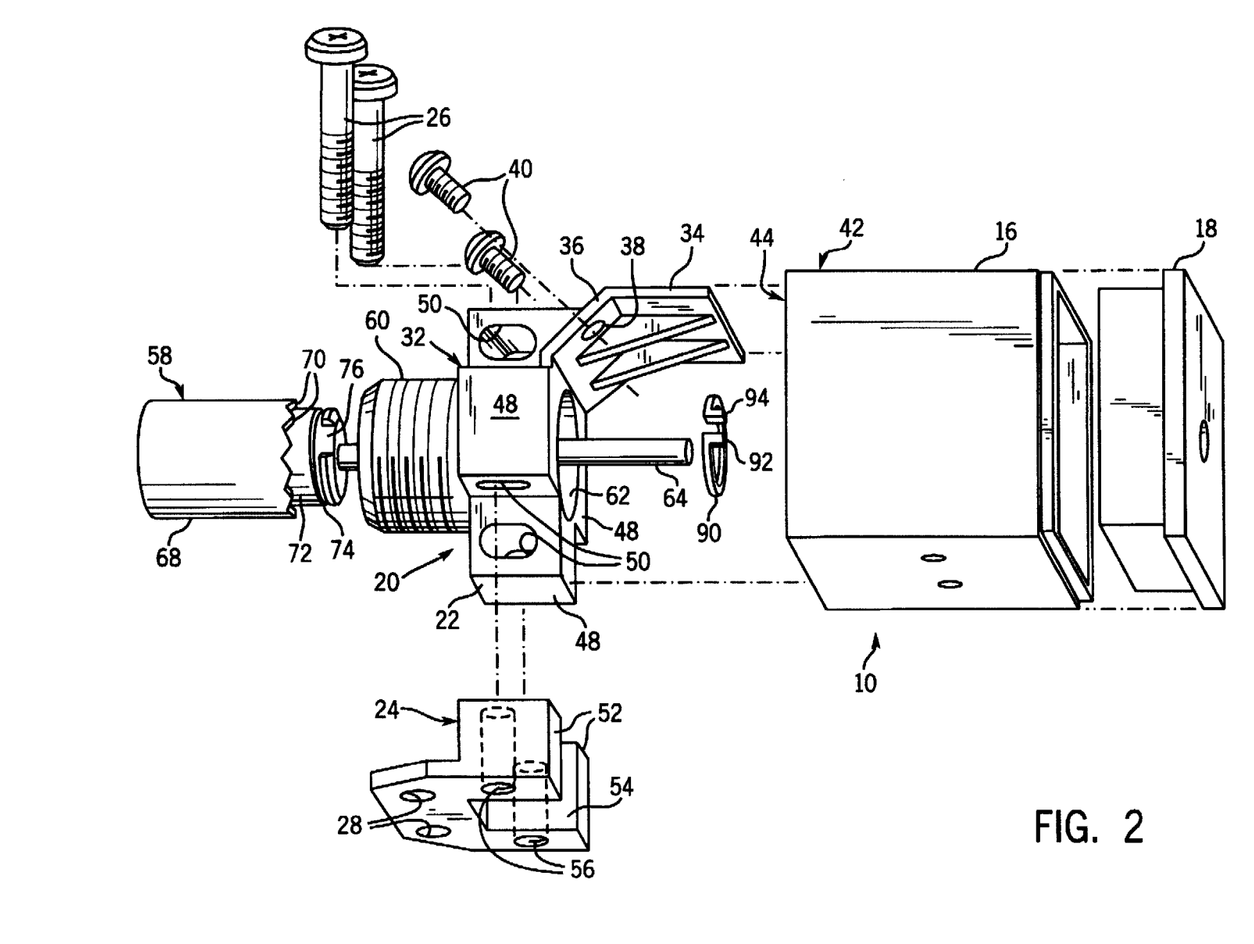
FIG. 2 is an exploded perspective view of the proximity switch of FIG. 1 illustrating a preferred embodiment particularly adapted for receiving industry standard pin connectors of the type shown in FIG. 1.

As shown in FIG. 2, support 22 includes a block 32 and an integral upper flange 34 extending at a right angle from block 32. An attachment portion 36 is preferably formed between block 32 and flange 34 and acts as an interface bracket for securing the support to housing 16. Thus, attachment portion 36 includes a pair of apertures 38 for receiving fasteners 40 for rigidly fastening support 22 to housing 16. Housing 16 includes a pair of mounting faces 42 and 44 sharing a common corner, as well as a pair of internally threaded attachment extensions 46 (see FIG. 3) between mounting faces 42 and 44 for receiving fasteners 40. As will be appreciated to those skilled in the art, this preferred structure permits housing 16 to be fastened to support 22 in two distinct orientations. In a first orientation, as shown in the FIGURES, block 32 overlies face 44 while flange 34 overlies face 42, effectively positioning sensing face 18 of switch 10 at an end position with respect to support 22. In the second orientation, housing 16 is rotated with respect to support 22 such that block 32 overlies face 42 and flange 34 overlies face 44, positioning sensing face 18 orthogonally with respect to support 22. In both orientations, apertures 38 overlie extensions 46 to permit fasteners 40 to solidly attach support 22 to housing 16 to maintain the selected orientation.

In addition to permitting selective orientation of sensing face 18, the preferred structure of support 22 permits switch 10 to be mounted in several angular orientations with respect to base 24 (or to a machine support surface when switch 10 is mounted directly thereon). To permit such mounting, support 22 is provided with a series of radially extending tabs or arms 48 through which apertures 50 are formed to receive fasteners 26. In the preferred embodiment illustrated, four such tabs 48 extend in block 32 at right angles. Base 24 has a structure designed to cooperate with tabs 48 and fasteners 26 to hold support 22 in one of four positions. In particular, base 24 includes a pair of risers 52 spaced from one another to define a recess 54 appropriately dimensioned to receive one of the radial tabs 48. Each riser includes an internally threaded bore 56 which, with support 22 mounted on base 24, aligns with a corresponding aperture 50 in a tab 48 for receiving a fastener 26. Thus, support 22 may be fixed in four different angular orientations on base 24. Moreover, because housing 16 can be positioned on support 22 so as to orient sensing surface 18 in an end or a side position as described above, by selecting the appropriate orientation of housing 16 on support 22 and of support 22 on base 24, switch 10 may be mounted with sensing surface 18 at an end position or at any one of four side positions.

Figure 3:
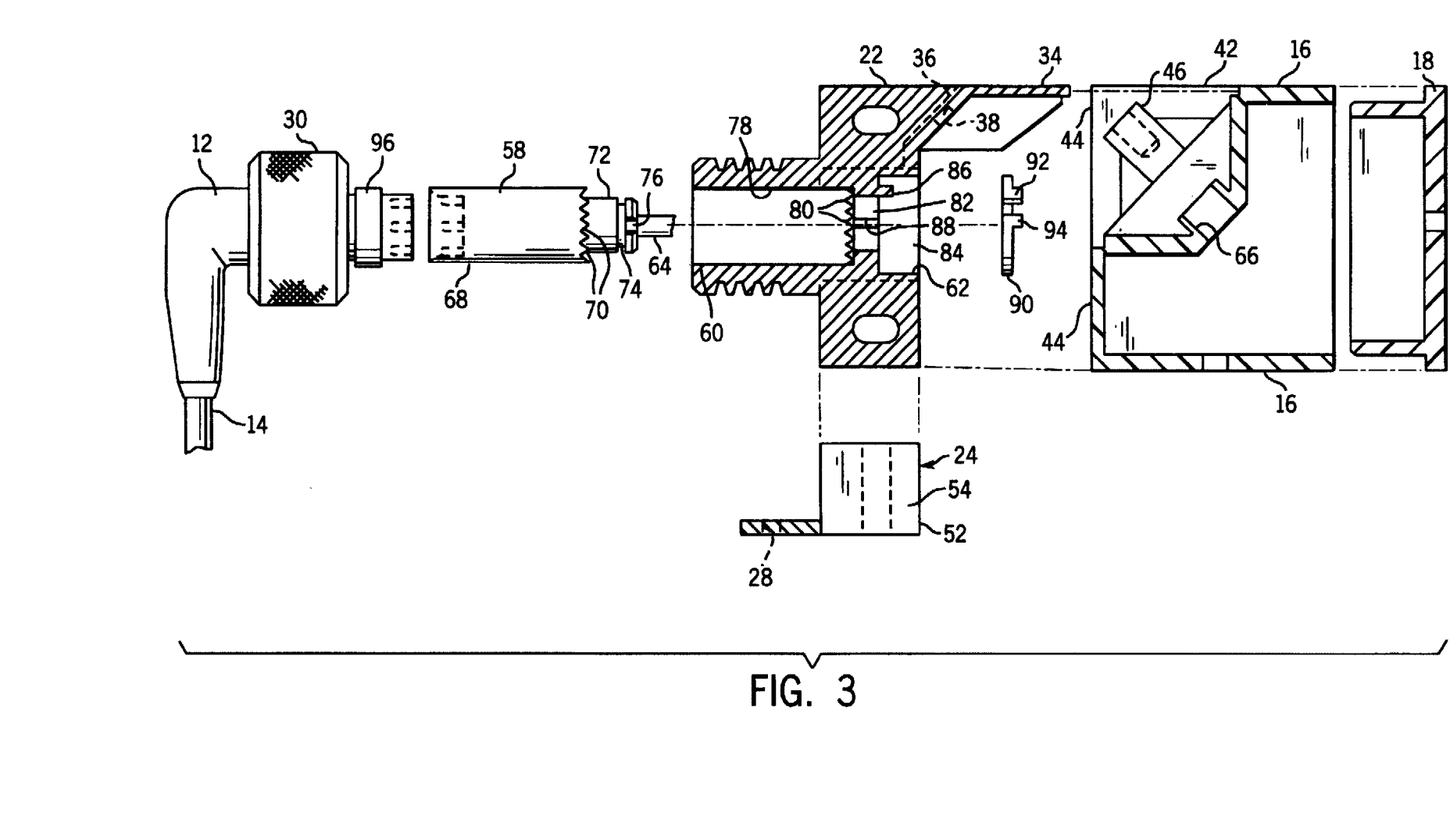
FIG. 3 is a partial sectional view of the proximity switch of FIGS. 1 and 2, showing a preferred internal configuration enabling the mounting structure to be interfaced with either pin connectors or cable connectors.
Figure 4:
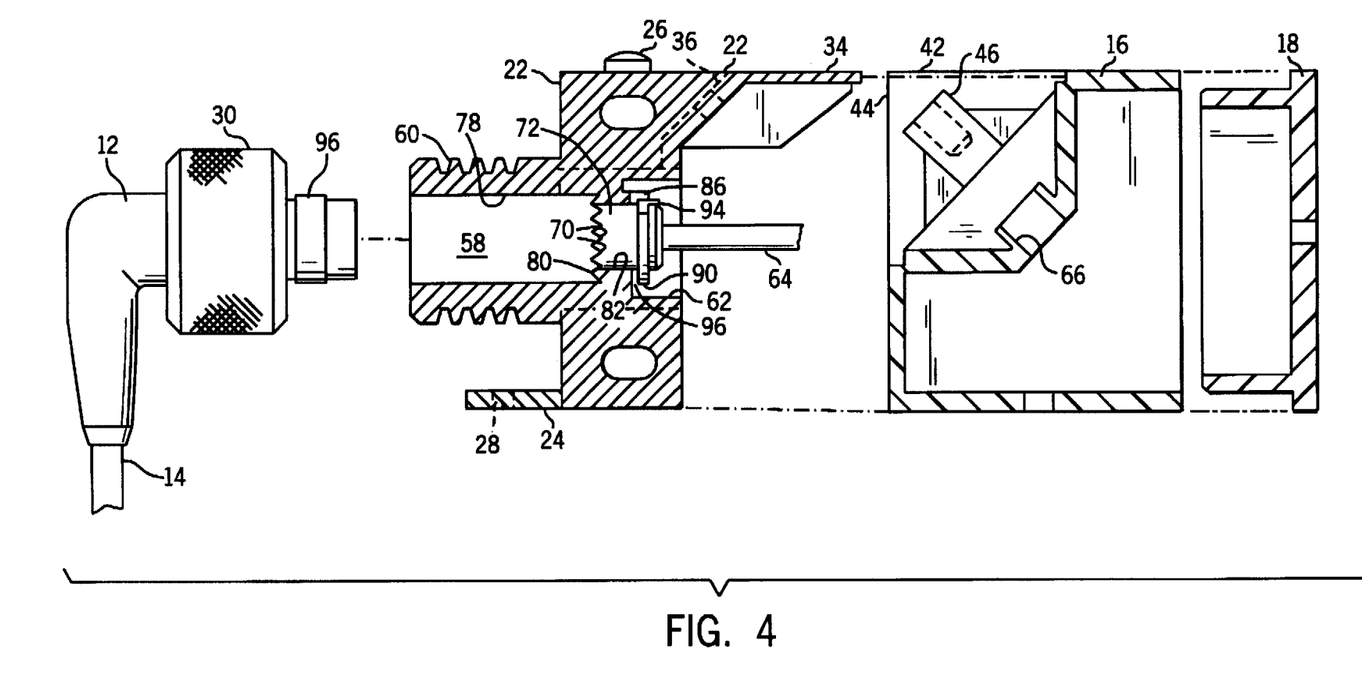
FIG. 4 is a partial sectional view of the proximity switch of FIG. 3, showing the placement of the connector receptacle within the mounting structure after assembly.
Figure 5:
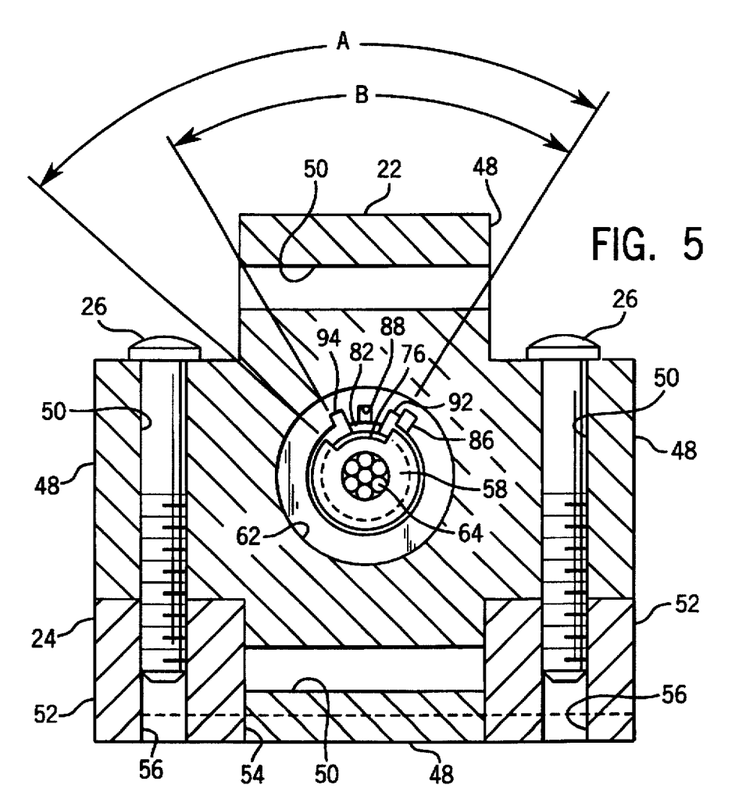
FIG. 5 is a sectional end view of the proximity switch of FIG. 4, illustrating the interaction between a retaining ring on the receptacle and a stop on the switch mounting structure for limiting rotation of the receptacle.
Figure 6:
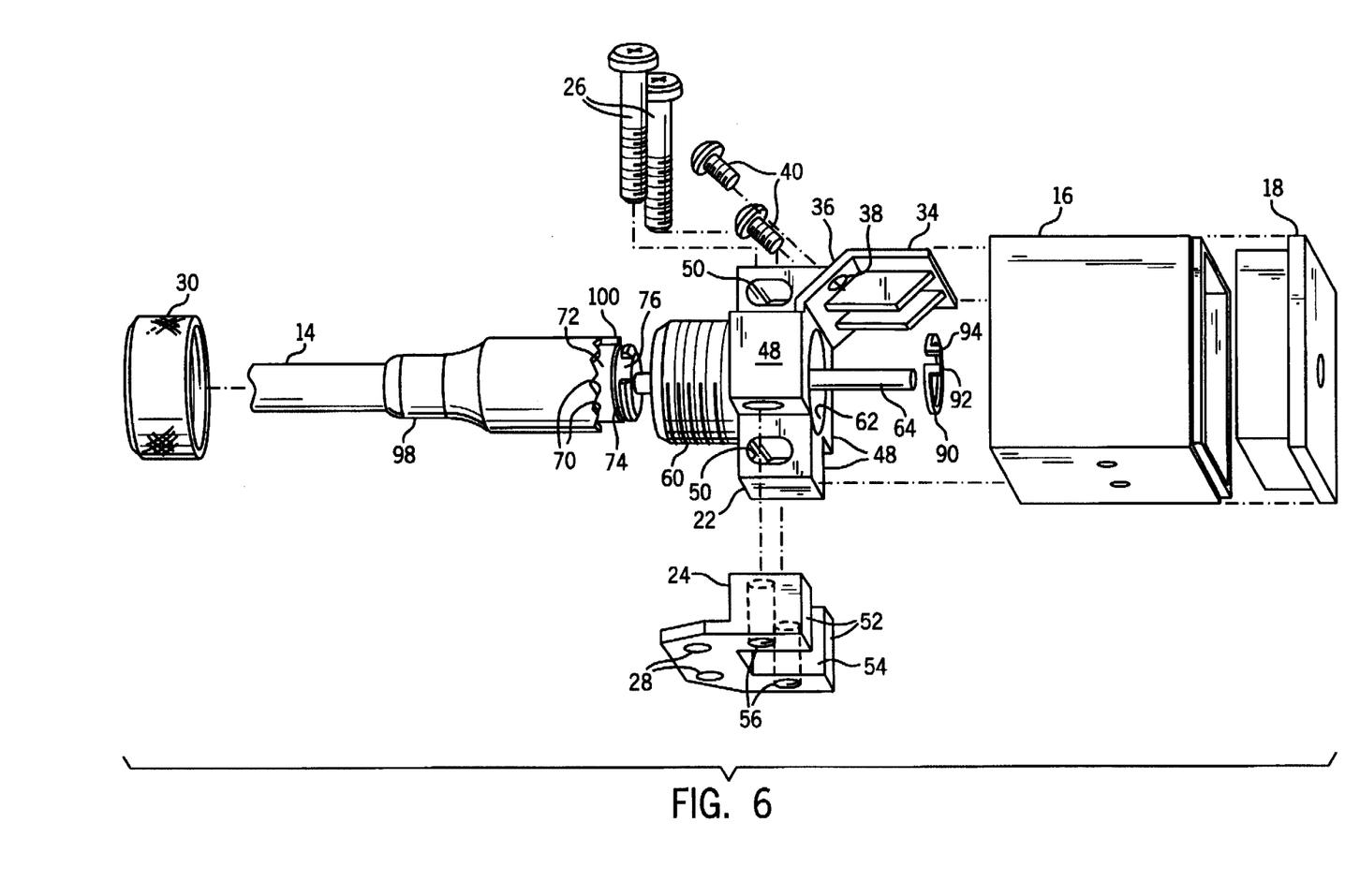
FIG. 6 is an exploded perspective view of a proximity switch having a construction substantially identical to that shown in FIG. 1, but equipped with a cable connector rather than a pin connector.
Figure 7:
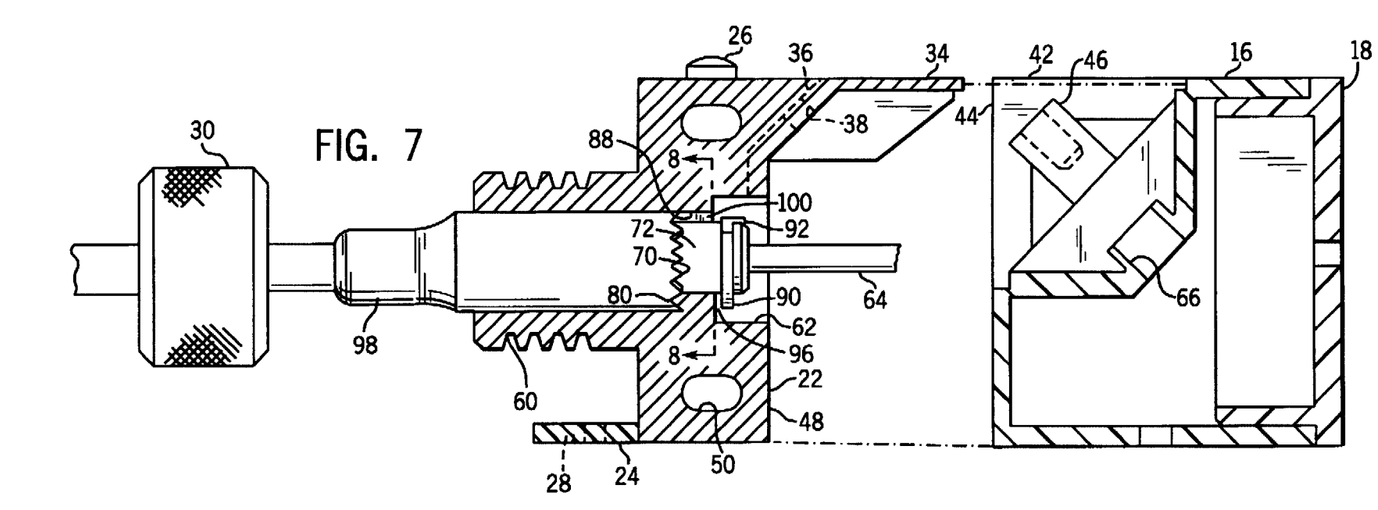
FIG. 7 is a partial sectional view of the switch of FIG. 6, illustrating the placement of the cable connector within the switch mounting structure after assembly.

Switch 10 is preferably adapted to receive both pin connectors 12 of the type illustrated in FIGS. 1, 3 and 4 as well as cable connectors as illustrated in FIGS. 6 and 7. Moreover, switch 10 may be configured to allow angled pin connectors to be selectively oriented in a number of discrete positions, such as to avoid interference with machine elements. To accommodate such pin connectors, in a first preferred embodiment illustrated in FIGS. 2 through 5, switch 10 includes a cylindrical connector receptacle 58. To receive and support connector 12 and receptacle 58, support 22 includes a threaded collar 60 extending from block 32. In the embodiment illustrated in FIGS. 1 through 8, collar 60 is formed integrally with block 32. Alternatively, collar 60 may be formed separately from block 32 and secured to block 32 during assembly, as described below with respect to FIGS. 9, 10 and 11. A central bore 62 extends through collar 60 and block 32 for passage of a cable 64 between receptacle 58 and the internal circuitry of switch 10 within housing 16. Receptacle 58 is preferably formed of a plastic insulating material and may be overmolded on cable 64 to form a receptacle subassembly for incorporation into switch 10. During assembly of switch 10, receptacle 58 is installed in collar 60 with cable 64 extending through bore 62 and through a wiring aperture 66 in housing 16 (see FIG. 3). Within housing 16, individual conductors comprising cable 64 are coupled to the switch circuitry in a conventional manner and housing 16 may be sealed by a suitable grommet or epoxy barrier at aperture 66.

As best illustrated in FIGS. 2 and 3, receptacle 58 includes a cylindrical section 68 terminating in a series of abutment surfaces 70, preferably in the form of V-shaped detents extending around the entire circumference of receptacle 58. Abutment surfaces 70 thus form a step down to a cylindrical extension 72. Cylindrical extension 72 includes an annular groove 74 and a notch 76 adjoining groove 74. In this first preferred embodiment, groove 74 and notch 76 are configured to receive a retainer 90 for holding receptacle within bore 62 and limiting rotation of receptacle 58 within bore 62 as described in detail below.

As shown in FIG. 3, to accommodate receptacle 58, bore 62 includes several adjacent sections of different diameter, including a first section 78, a reduced diameter section 82 and an enlarged section 84. First section 78 is positioned generally within threaded collar 60 and terminates in a series of abutment surfaces 80. Sections 78 and 82 of bore 62 have internal diameters slightly larger than the diameters of sections 68 and 72, respectively, of receptacle 58 such that receptacle 58 may be easily rotated and slid within bore 62. Moreover, abutment surfaces 70 of receptacle 58 and abutment surfaces 80 of support 22 have complementary configurations, such that, when receptacle 58 is fully inserted within bore 62, surfaces 70 and 80 mate or mesh to prevent rotation of receptacle 58. In addition to these features, bore 62 includes a projection 86 extending into enlarged section 84, and a longitudinal groove or keyway 88 extending through reduced diameter section 82. Projection 86 acts as a stop for flanged ends 92 and 94 of retainer 90 as described below, while keyway 88 prevents rotation of a cable connector when used with switch 10 as described in detail with respect to FIGS. 6, 7 and 8.

After assembly, receptacle 58 is housed within support 22 as illustrated in FIG. 4. With receptacle 58 fully inserted in bore 62, retainer 90 is inserted into enlarged section 84 around cable 64 and snapped into groove 74. Flanged ends 92 and 94 extend into notch 76 (see FIG. 5), as well as radially outwardly from notch 76. Retainer 90 has an outer diameter larger than the diameter of section 82, such that, once installed into groove 74 retainer 90 limits axial movement of receptacle 58 and prevents its removal from bore 62. In addition, groove 74 is suitably positioned on extension 72 of receptacle 58 such that, with retainer 90 installed in groove 74 receptacle 58 is able to slide axially within bore 62 a distance 96 (see FIG. 4), slightly greater than the axial height of abutment surfaces 70 and 80. Thus, receptacle 58 may be slid fully within bore 62 (i.e. to the right in FIG. 4) to mutually engage abutment surfaces 70 and 80, thereby blocking receptacle 58 from rotation within support 22. To reposition receptacle 58 angularly within support 22, receptacle 22 may be slid within bore 62 (i.e. to the left in FIG. 4), until retainer 90 contacts the edge of reduced diameter section 82 and abutment surfaces 70 and 80 clear one another. In this position, receptacle 58 may be freely rotated, then maintained in a selected angular orientation by sliding receptacle 58 within bore 62 to engage abutment surfaces 70 and 80.

With receptacle 58 situated in the desired angular orientation, pin connector 12 is inserted and the entire assembly locked into the desired orientation. As best illustrated in FIGS. 3 and 4, in the preferred embodiment connector 12 includes an integral securing ring 96 that cooperates with nut 30 to press receptacle 58 into full engagement within bore 62 as nut 30 is screwed into place on collar 60. Ring 96 thus serves both to seal the joint between connector 12 and receptacle 58, and to lock receptacle 58 in the desired angular orientation. Subsequent angular adjustment of connector 12 is accomplished by loosening nut 30 to permit receptacle 58 to be slid axially until surfaces 70 and 80 are clear of one another. Receptacle 58 may be then freely rotated to a different angular orientation and nut 30 again tightened to lock receptacle 58 in the selected position. Such adjustments may be made without removal of connector 12 from receptacle 58, when desired, and without the need for separate or special tooling.

To prevent damage to the conductors within cable 64, rotation of receptacle 58 is limited as follows. As best illustrated in FIG. 5, flanged ends 92 and 94 of retainer 90 extend into notch 76 as well as radially outwardly. Moreover, retainer 90 is installed on receptacle 58 such that projection 86 lies outside of a space extending from notch 76 and bounded by flanges 92 and 94. When receptacle 58 is rotated within bore 62 flanges 92 and 94 impinge against projection 86 to limit rotation of receptacle 58. Thus, when moved axially to disengage abutment surfaces 70 and 80, receptacle 58 is free to rotate only within the limits imposed by abutment of flanges 92 and 94 against projection 86.

It should be noted that this preferred arrangement may be adapted to limit rotation of receptacle 58 to more or less than 360 degrees by appropriately forming notch 76 and flanged ends 92 and 94 of retainer 90. In particular, notch 76 forms a radial opening in the end of receptacle 58 of preset width, as denoted by angle A in FIG. 5. Similarly, flanged ends 92 and 94 of retainer 90 form a preset angle, denoted B in FIG. 5. In the embodiment illustrated in FIG. 5, angle A is somewhat larger than, thus limiting rotation of receptacle 58 to somewhat less than 360 degrees (i.e. 360−B+(A−B)). Thus, receptacle 58 may be freely rotated past the point when either flanged end 92 or 94 contacts projection 86, until the inwardly projection portion of end 92 or 94 contacts an end of notch 76. However, where less rotation is desired, angle A may be made equal to angle B. Conversely, where greater rotation is desired, angle A of notch 76 may be made substantially larger than angle B of retainer 90. Thus, if angle A is twice as large as angle B, receptacle 58 will be permitted to rotate 360 degrees. Angle A may be further enlarged to permit rotation of receptacle through more than 360 degrees.

From the foregoing it will be appreciated that, in addition to selectively permitting several different mounting orientations for switch 10, mounting structure 20 allows a pin connector 12 coupled to the switch to be held in one of several discrete angular orientations as defined by the rotational position of receptacle 58. The number of angular positions will depend upon the number of detents or abutment surfaces on receptacle 58 and support 22, and may include, for example, a stable position for every 22.5 degrees of rotation. Moreover, although in the preferred embodiment illustrated the abutment surfaces for locking the receptacle in a desired orientation comprise a number of detents or mutually engaging teeth, a number of variants on this structure may be envisioned without departing from the scope of the appended claims. For example, the particular form of the detents may be altered or the receptacle may be provided with a number of detents and the support structure with a single engaging tooth or vice versa. In addition, while the ranged ends of retainer 90 preferably limit rotation of receptacle 58 to slightly less than 360 degrees, a greater or lesser rotation may be provided by appropriately spacing the ranged ends from one another and broadening or narrowing the 76.

Figure 8:
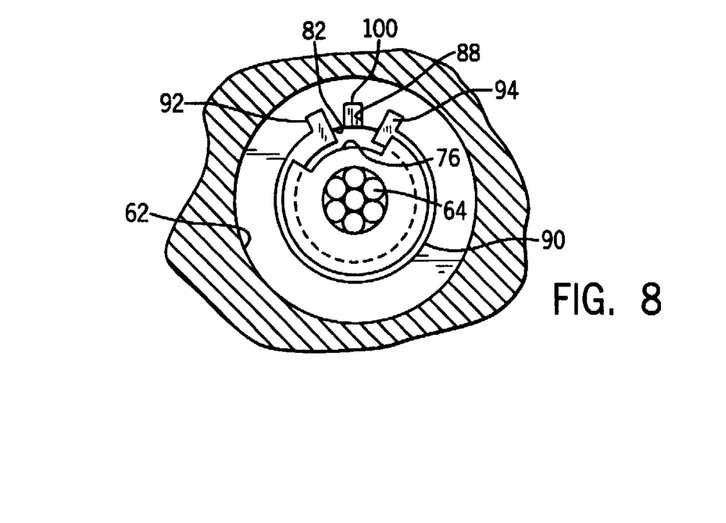
FIG. 8 is a sectional end view of the switch of FIG. 7, showing how the cable connector is preferably restrained from rotation within the mounting structure.

As illustrated in FIGS. 6, 7 and 8, the mounting structure described above is preferably configured to permit the use of a cable connector 98 designed to be permanently coupled to switch 10 via a conductor bundle 64. The physical structures of support 22, base 24 and housing 16 shown in FIGS. 6, 7 and 8 may be identical to those described above and, as previously mentioned, permit selective orientation of switch 10 and particularly of sensing face 18 in several positions. Because cable connectors 98 extend generally straight from support 22 and typically need not be rotated as do angled connectors 12, such cable connectors 98 preferably include a longitudinal projection or key 100 extending along cylindrical extension 72. In all other respects, the external features of connector 98 may be substantially identical to those described above with respect to receptacle 58. As best shown in FIGS. 7 and 8, when cable connector 98 is inserted into bore 62, key 100 slides into longitudinal groove or keyway 88 in reduced diameter section 82 of bore 62. This arrangement effectively prevents rotation of cable connector 98 in support 22 once connector 98 is fully inserted into bore 62 and retained in place by retainer 90.

Although cable connector 98 conveniently includes abutment surfaces 70 identical to those provided on receptacle 58 to ensure compatibility with support 22, it should be understood that such features could be eliminated from connector 98 so long as such compatibility is otherwise provided or where compatibility between the support structures is not desired. Moreover, while such connectors 98 ordinarily need not be rotated, the arrangement described above could be modified to permit such rotation by eliminating protrusion 100, permitting rotation and selective angular orientation of connector 98 in the same fashion as described above with respect to receptacle 58.

Figures 9, 10:
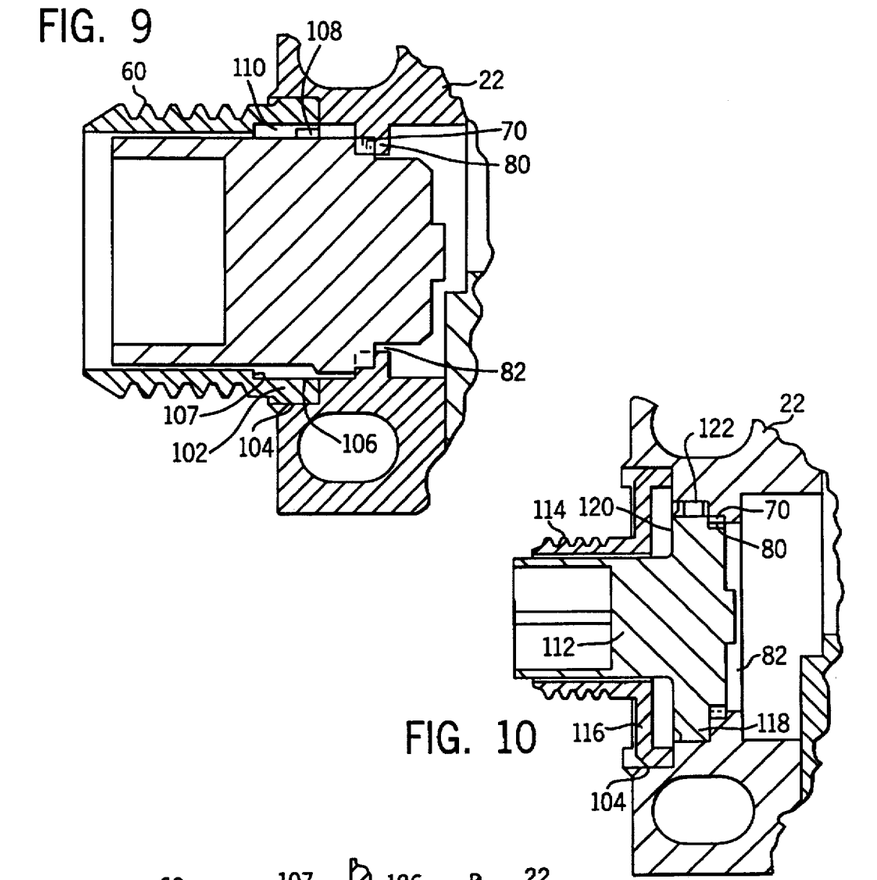
FIG. 9 is a sectional view of a portion of the proximity switch housing and connector, illustrating a preferred alternative embodiment for securing a receptacle to the switch housing.
FIG. 10 is a similar sectional view showing how the alternative embodiment may be adapted for use with a smaller receptacle.
Figure 11:
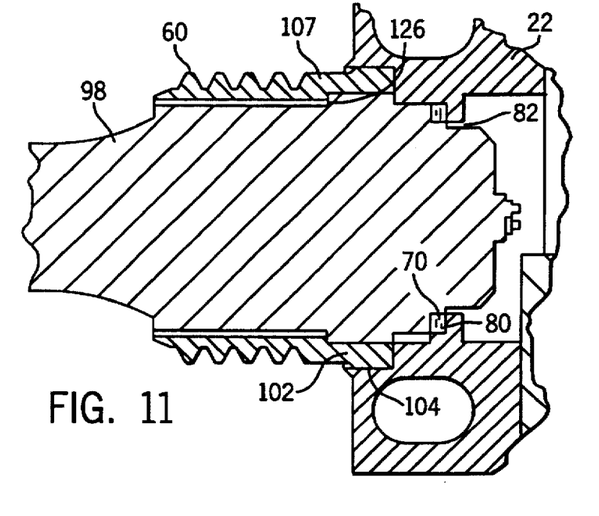
FIG. 11 is a sectional view of the alternative housing structure shown in FIGS. 9 and 10, illustrating how the structure may be used with a permanently installed cable connection.

FIGS. 9, 10 and 11 illustrate preferred alternative embodiments of switch 10, wherein block 32 of support 22 is formed separately from collar 60 and a receptacle or cable connector is lodged between block 32 and collar 60 during assembly of switch 10. As shown in FIG. 9, in this embodiment, collar 60 includes an outer surface 102 that is press or interference fitted to an inner surface 104 of block 32. Receptacle 58, which may be formed without notch 76 or groove 74, is positioned between collar 60 and block 32 prior to pressing collar 60 in place during assembly of switch 10, and remains in place thereafter. Receptacle 58 includes 70 designed to engage surfaces 80 on support 22 as described above to lock receptacle in place. However, in this embodiment, collar 60 includes an enlarged open region 106 bounded by an annular end 107, while receptacle 58 includes a peripheral extension 108 at a predetermined location on its outer surface. Extension 108 serves to contact annular end 107 of collar 60 to limit axial movement of receptacle 58 in collar 60, but permits sufficient movement of receptacle 58 to allow surfaces 70 and 80 to clear one another for angular adjustment of receptacle 58 as described above. Moreover, collar 60 includes an abutment member 110 extending from the inner surface thereof into enlarged open region 106. Abutment member 110 serves to contact extension 108 to limit rotation of receptacle 58 within collar 60. Installation of switch 10, coupling of connector 12, and angular adjustment and locking of receptacle 58 may in all other respects be substantially the same as described above with respect to the embodiment illustrated in FIGS. 1 through 5.

FIG. 10 illustrates a varient of the embodiment shown in FIG. 9. In particular, FIG. 10 shows how the structure of block 32 shown in FIG. 9 may be used for assembling switch 10 with a "micro" or smaller-sized receptacle 112. In this embodiment, smaller format receptacle 112 extends into a collar 114 having an annular flange portion 116. Flange portion 116 is press or interference fitted into inner surface 104 of block 32 as describe above during assembly of switch 10, with receptacle 112 positioned between collar 114 and block 32. Receptacle 112 includes an enlarged centering region 118 designed to contact the inner surface of block 32 as illustrated in FIG. 10 and to permit sliding movement of receptacle 112 within block 32 while maintaining receptacle 112 properly centered therein. Centering region 118 forms an abutment face 120 that contacts flange portion 116 of collar 114 when receptacle 112 is slid axially during angular adjustment of receptacle 112. A peripheral extension 122 is provided on receptacle 112 for contacting a corresponding extension within block 32 or collar 114 for limiting rotation of receptacle 112, in substantially the same manner as described above with reference to FIG. 9.

As shown in FIG. 11, the preferred alternative embodiment of block 32 and collar 60 illustrated in FIG. 9 may be adapted for use with in a straight cable version of switch 10. As indicated above, such straight cable versions generally do not require angular adjustment of the cable connector 98 once installed in switch 10. Thus, where collar 60 is press or interference fitted into block 32, connector 98 may include an enlarged portion 124 designed to fit within and substantially fill enlarged open region 106 of collar 60. Enlarged position has a lip or abutment surface 126 that contacts or rests close to annular end 107 of enlarged open region 106 when collar 60 is pressed into place within block 32. Thus, abutment of surface 126 with end 107 effectively prevents disengagement of surfaces 70 and 80, thereby preventing rotation of connector 98 in collar 60. Alternatively, surfaces 70 may be eliminated from connector 98 and rotation of connector 98 prevented by a groove (not shown) appropriately positioned and dimensioned to receive abutment member 110 mentioned above with respect to FIG. 9.

While the embodiments illustrated in the FIGUGRES and described above are presently preferred, it should be understood that these embodiments are offered by way of example only. The invention is not intended to be limited to any particular embodiment, but is intended to extend to various modifications that nevertheless fall within the scope of the appended claims.

I claim:

1. A proximity sensor comprising:
   sensor circuitry for detecting the presence of a target within an effective range and for changing a state of a switch upon detection of the target;
   an enclosure housing the sensor circuitry;
   conductors for coupling the sensor circuitry to an external circuit;
   a support for mounting the enclosure in a desired orientation, the support including a bore through which the conductors pass, a first abutment surface and a threaded extension; and
   a connector receptacle rotatably received within the bore and the threaded extension and coupled to the conductors, the connector receptacle including a second abutment surface configured to cooperate with the first abutment surface to selectively prevent rotation of the receptacle, the connector receptacle configured to receive a connector plug including a threaded nut, wherein rotation of the receptacle is selectively prevented by tightening the nut on the extension, thereby maintaining the abutment surfaces in mutual engagement.

2. The proximity sensor of claim 1, wherein the first abutment surface is one of a plurality of first detents and the second abutment surface is one of a plurality of second detents, the first and second detents mating to selectively prevent rotation of the connector receptacle.

3. The proximity sensor of claim 1, wherein the receptacle is slidable within the bore and the first and second abutment surfaces are mutually engaged to selectively prevent rotation of the receptacle by axial movement of the receptacle.

4. The proximity sensor of claim 1, wherein the first and second abutment surfaces are configured to mutually engage one another in a plurality of discrete angular orientations.

5. The proximity sensor of claim 1, wherein the enclosure has a sensing face and the support is configured for mounting the enclosure selectively in a first orientation or a second orientation orthogonal to the first orientation.

6. The proximity sensor of claim 1, wherein the receptacle includes an annular groove and a retaining ring received in the groove, and wherein the support includes a retaining surface cooperating with the retaining ring to prevent removal of the receptacle from the bore and permitting axial movement of the receptacle within the bore.

7. The proximity sensor of claim 6, wherein the support further includes a stop, the receptacle includes a notch adjacent to the groove and the retaining ring includes a flange extending into the notch, the flange abutting the stop to limit rotation of the receptacle in the bore.

8. The proximity sensor of claim 1, wherein the receptacle is formed on a free end of the conductors by overmolding.

9. A support for mounting a proximity sensor of the type including sensor circuitry for detecting the presence of an object of interest and for changing a state of a switch upon detection of the object, an enclosure housing the sensor circuitry and conductors for coupling the sensor circuitry to an external circuit, the support comprising:

an interface bracket for securing the support to the enclosure;

a bore for rotatably receiving a connector receptacle coupled to the conductors; and an abutment surface in the bore for cooperating with a corresponding surface on the connector receptacle to selectively prevent rotation of the receptacle, and a tang projecting radially from the bore and configured to engage a detachable base for securing the support to a mounting surface.

10. The support of claim 9, further comprising a threaded extension configured to mate with a connector plug, the bore extending within the extension for receiving the receptacle.

11. The support of claim 9, wherein the bore has an annular end region and wherein the abutment surface is a projection from the end region.

12. The support of claim 9, wherein the abutment surface is one of a plurality of detents.

13. The support of claim 9, wherein the support is configured to receive a cable assembly coupled to the conductors and wherein the support further comprises an internal keyway notch for receiving a projection from the cable assembly to prevent rotation of the cable assembly in the bore.

14. The support of claim 9, wherein the support includes four tangs projecting radially at right angles from the bore.

15. A mounting structure for a proximity switch of the type including sensor circuitry for detecting the presence of an object of interest and for changing a state of a switch upon detection of the object, an enclosure housing the sensor circuitry and conductors for coupling the sensor circuitry to an external circuit, the structure comprising:

a support including an interface for attaching the support to the enclosure, a bore permitting passage of the conductors to the sensor circuitry and a plurality of projections extending substantially radially with respect to the bore; and a base having at least one mounting aperture for attaching the base to a mounting surface and a recess for receiving one of the projections to secure the support in a desired angular orientation.

16. The mounting structure of claim 15, wherein the base includes a pair of threaded bores for receiving securing fasteners and wherein the support includes four radially extending projections, each projection having an aperture for permitting passage of a securing fastener when the support is secured to the base.

17. The mounting structure of claim 15, wherein the support interface permits attachment of the support to the enclosure in at least two alternative orientations.

* * * * *